United States Patent [19]

Ilderem et al.

[11] Patent Number: 4,957,777
[45] Date of Patent: Sep. 18, 1990

[54] VERY LOW PRESSURE CHEMICAL VAPOR DEPOSITION PROCESS FOR DEPOSITION OF TITANIUM SILICIDE FILMS

[75] Inventors: Vida Ilderem, Puyallup, Wash.; L. Rafael Reif, Newton; Prabha K. Tedrow, Lexington, both of Mass.

[73] Assignee: Massachusetts Institute of Technology, Cambridge, Mass.

[21] Appl. No.: 423,494

[22] Filed: Oct. 12, 1989

[51] Int. Cl.$^5$ .................... B05D 3/06; C23C 16/42
[52] U.S. Cl. .................... 427/55; 427/255; 427/255.2; 437/200; 437/225
[58] Field of Search ............... 427/55, 99, 255, 255.2, 427/255.7; 437/200, 225, 234

[56] References Cited

U.S. PATENT DOCUMENTS

| | | | |
|---|---|---|---|
| 3,801,365 | 4/1974 | Hrzek | 437/200 |
| 4,359,490 | 11/1982 | Lehrer | 427/255.2 |
| 4,362,597 | 12/1982 | Fraser et al. | 437/200 |
| 4,501,769 | 2/1985 | Hieber et al. | 437/200 |
| 4,504,521 | 3/1985 | Widmer et al. | 427/255.2 |
| 4,557,943 | 12/1985 | Rosler et al. | 427/255.2 |
| 4,568,565 | 2/1986 | Gupta et al. | 427/255.2 |
| 4,619,038 | 10/1986 | Pintchovski | 427/255.2 |
| 4,635,347 | 1/1987 | Lien et al. | 437/200 |
| 4,657,628 | 4/1987 | Holloway et al. | 437/200 |
| 4,668,530 | 5/1987 | Reif et al. | 427/255.2 |
| 4,690,730 | 1/1987 | Tang et al. | 437/200 |

FOREIGN PATENT DOCUMENTS

| | | | |
|---|---|---|---|
| 0234593 | 2/1987 | European Pat. Off. | 427/255.2 |
| 0245934 | 3/1987 | European Pat. Off. | 427/255.2 |

OTHER PUBLICATIONS

C. M. Osburn et al., "High Conductivity Diffusions and Gate Regions Using Self-Aligned Silicide Technology," Dell'Oca & Bullis (ed), Electrochem. Soc., Pennington, N.J., 82–7:213–223, (1982).
C. Y. Ting et al., "The Use of TiSi$_2$ in a Self-Aligned Silicide Technology," Dell'Oca and Bullis (ed), Electrochem. Soc., Pennington, N.J., 82–7:224–231, (1982).
Rosler and Engle, "Plasma-Enhanced CVD of Titanium Silicide," J. Vac. Sci. Technol., 8(2(4)):733–737, (1984).
M. J. H. Kemper et al., "CVD and Plasma Enhanced CVD of TiSi$_2$," Extended Abstracts, Electrochem. Soc. Fall Mtg. (New Orleans), 84–2:533–534, (1984).
P. K. Tedrow et al., "Low Pressure Chemical Vapor Deposition of Titanium Silicide," Appl. Phys. Lett., 46(2):189–191, (1985).
A. Bouteville et al., "LPCVD of Titanium Disilicide," J. Electrochem. Soc., 134(8):2080–2083, (1987).
S. Ahmad et al., "A Simple Method of Depositing Oxygen-Free Titanium Silicide Films Using Vacuum Evaporation," Thin Solid Films, 143:155–162, (1986).
S. L. Zhang et al., "Selective LPCVD-W Deposition on Silicides," Vide, Couches Minces, 42:195–197, (1987).
S. S. Chen et al., "Properties of TiSi$_2$ as an Encroachment Barrier for the Growth of Selective Tungsten on Silicon," J. Vac. Sci. Technol., B5(6):1730–1735, (1987).
E. K. Broadbent et al., "Characterization of Titanium Silicide Films Formed by Composite Sputtering and Rapid Thermal Annealing," Thin Solid Films, 151:51–63, (1987).

(List continued on next page.)

Primary Examiner—Sadie Childs
Attorney, Agent, or Firm—Hamilton, Brook, Smith & Reynolds

[57] ABSTRACT

The selective or blanket deposition of titanium silicide using a Very Low Pressure Chemical Vapor Deposition process is described. Silane and titanium tetrachloride are used as the silicon and titanium sources, respectively. A thin polysilicon layer is deposited prior to the silicide deposition to promote the nucleation of titanium silicide. It is shown that selective deposition is possible by controlling the polysilicon and the titanium silicide deposition times. The resulting titanium silicide films have resistivities in the range of 15–25 micro-ohms-cm.

14 Claims, 7 Drawing Sheets

OTHER PUBLICATIONS

W. Kern and G. L. Schnable, "Low-Press Chemical Vapor Deposition for Very Large-Scale Integration Processing—A Review," *IEEE Trans. Electron Devices*, 26(4):647–657, (1979).

S. P. Murarka et al., "Refractory Silicides of Titanium and Tantalum for Low-Resistivity Gates and Interconnects," *IEEE J. Solid-State Circuits*, SC-15(4):474–482, (1980).

M. E. Alperin et al., "Development of the Self-Aligned Titanium Silicide Process for VLSI Applications," *IEEE J. Solid-State Circuits*, SC-20(1):61–69, (1985).

G. A. West et al., "Laser-Induced Chemical Vapor Deposition of Titanium Silicide Films," *J. Vac. Sci. Technol.*, A3(6):2278–2282, (1985).

S. P. Murarka, "Refractory Silicides for Integrated Circuits," *J. Vac. Sci. Technol.*, 17(4):775–792, (1980).

S. Lyer and C. Y. Ting, "New Salicide Spacer Technology," *IBM Tech. Discl. Bulletin*, 27(3):1801–1802, (1984).

P. K. Tedrow et al., "Titanium Silicide Films Deposited by Low Pressure Chemical Vapor Deposition," *Mat. Res. Soc. Symp. Proc.*, 37:619–622, (1985).

V. Ilderem et al., "Properties of Titanium Silicide Films Deposited by an LPCVD," Tenth Int'l CVD Conf. Extended Abstract, Fall Meeting Electrochem. Soc., 87-2, Abstract No. 1058, p. 1467, (1987).

"Novel Selective Poly- and Epitaxial-Silicon Growth (SPEG) Technique for ULSI Processing", Mieno et al., IEDM 87, pp. 16–19.

VERY LOW PRESSURE CHEMICAL VAPOR DEPOSITION PROCESS FOR DEPOSITION OF TITANIUM SILICIDE FILMS

This is a continuation of application Ser. No. 300,322, filed on Jan. 23, 1989, now abandoned, which is a continuation-in-part of Ser. No. 255,247, filed on July 28, 1988, now abandoned.

TECHNICAL FIELD

This invention is in the field of semiconductors and more specifically formation of polycrystalline titanium silicide films on substrates.

BACKGROUND ART

Because of its excellent material properties, heretofore, polysilicon has been the chief material used in the formation of integrated circuits.

In order to take advantage of the emerging technology of faster and smaller integrated circuit devices, it has become necessary to develop new materials which can be used as interconnection and gate materials instead of, or in conjunction with, polysilicon. These materials must have lower resistivity than polysilicon and should be compatible with current integrated circuit processes. Silicides of refractory metals (Mo, W. Ti and Ta) with their metallic conductivity and high temperature stability, meet these requirements.

One such silicide, in particular, titanium silicide ($TiSi_2$) has been used as gate, contact and interconnect metallization in integrated circuit technologies due to its low resistivity and the low annealing temperature required to form the stable, low resistivity silicide phase. $TiSi_2$ has found wide applications in the self-aligned silicide (salicide) technology [C. M. Osburn, M. Y. Tsai, S. Roberts, C. J. Lucchese and C. Y. Ting, *VLSI Science and Technology*/1982, edited by C. J. Dell-'Oca and W. M. Bullis (Electrochem. Soc. Pennington, N.J., 1982), 82-7, p. 213 and C. Y. Ting. S. S. Iyer, C. M. Osburn C. J. Hu and A. M. Schweighart, *VLSI Science and Technology*/1982, edited by C. J. Dell'Oca and W. M. Bullis (Electrochem. Soc Pennington, N.J. 1982) 82-7, p. 224]. In the salicide process Ti is deposited by a Physical Vapor Deposition technique onto a patterned wafer. A two-step annealing process, which prevents bridging between the source/drain and the gate in a Metal-Oxide-Semiconductor transistor is then used to form titanium silicide in the regions where silicon is exposed. The unreacted metal on the oxide is then selectively removed by wet chemical etching.

Rosler et al (U.S. Pat. No. 4,557,943 issued 12/10/85) discloses a plasma enhanced CVD (PECVD) process for depositing $TiSi_2$ films from $SiH_4$ and $TiCl_4$ and plasma. At column 3, lines 32-41, they note that:

"It has been discovered that the sheet resistance of a given titanium silicide deposition is lower over silicon than over oxide, perhaps due to silicon incorporation during the anneal process. Also, the titanium silicide is more likely to be hazy or peel when deposited over oxide. To optimize the deposition for the microelectronic application, it has been found expedient to deposit a thin layer—e.g. 300 to 600 Å—of amorphous silicon prior to the silicide deposition."

Rosler and Engle in *J. Vac. Sci. Technol.* 8, 2(4) 733 (1984), also report that the as-deposited silicide films were amorphous and an annealing temperature of 600–650° C. brought the resistivity down to about 15–20 micro-ohms-cm. A small amount of chlorine was detected in the as-deposited films, which after sintering, was not detectable.

Pintchovski in U.S Pat. No. 4,619,038 issued 28 Oct. 1986 teaches selective formation of $TiSi_2$ by high temperature 700° –1000° C. LPCVD of a titanium halide gas and an excess of hydrogen. Pintchovski's reaction takes place "in the absence of a silicon bearing gas". Pintchovski's reaction is:

$$"2TiCl_4(g) + Si(s) \rightarrow 2TiCl_2(s) + SiCl_4(g) \quad (1)$$

or $$TiCl_2(s) + 2Si_2(s) + H_2(g) \rightarrow TiSi_2(s) + 2HCl(g) \quad (2)"$$

Hieber et al. (U.S. Pat. No. 4,501,769, issued 2/26/85 claiming priority in Germany to 3/30/82) teaches selective deposition of high melting point (HMP) metal silicides ($TaSi_2$) on Si surfaces by CVD of gaseous Si ($SiH_2Cl_2$) and a HMP halogen (e g., $TaCl_5$). Hieber et al. postulates that:

"The following considerations may, at least in part, explain the substrate-associated, and, thus, the selective deposition of the metal silicides:

On the basis of thermo-dynamic calculations, tantalum disilicide, in order to be formed in accordance with the equation:

$$TaCl_5 + 2SiH_2Cl_2 + 2.5H_2 \rightarrow TaSi_2 + 9HCl$$

must be capable of formation at temperatures around 800° C., independently of the substrate material. The fact that, with the inventive method, the foregoing reaction does not occur on, for example, $SiO_2$, or occurs only very slowly thereon, could be connected to the fact that the reaction gas mixture releases an excess of, for example, chlorine, or hydrogen chloride, which inhibits the course of the reaction in the described manner. Hydrogen disassociating at the silicon surface could contribute to the formation of monosilane so that a reaction in accordance with the following equation:

$$TaCl_5 + 2SiH_4 \rightarrow TaSi_2 + 5HCl + 1.5H_2$$

occurs at the silicon surface. The foregoing reaction is extremely favored thermo-dynamically and could thus explain the high selectivity of HMP metal silicide deposition on silicon surface areas in accordance with the principles of the invention."

Hieber et al. includes molybdenum, tungsten and tantalum in the group of HMP metals, but does not mention titanium.

Kemper et al., *Extended Abstracts*, Electrochem. Soc. Fall Meeting (New Orleans 1984), 84-2, p. 533, reports on low pressure CVD and Plasma enhanced CVD of $TiSi_2$ on bare Si wafers, wafers covered with thermal $SiO_2$ or LPCVD $Si_3N_4$.

Kemper et al investigated the LPCVD of titanium silicide in a temperature range of 600°–800° C., a pressure range of 0.1-5 Torr, and a $TiCl_4/SiH_4$ or $TiCl_4/SiH_2Cl_2$ ratio of 0.1-10. They observed that LPCVD titanium silicide did not nucleate using only $TiCl_4$ and $SiH_4$; instead, an in-situ deposited polysilicon layer prior to the silicide deposition was necessary for the nucleation of titanium silicide. They concluded that any native oxide inhibited the deposition of titanium silicide. They also indicated that the surface roughness of the LPCVD silicide films deposited in their reactor was unacceptable, and speculated that a better vacuum system would have yielded smooth films.

Kemper et al. also experimented with the PECVD of titanium silicide. The PECVD films were deposited in a parallel plate experimental reactor with the wafers placed on the ground electrode. The following deposition conditions were used: deposition temperatures of 300° and 350° C., $TiCl_4/SiH_4$ ratios of 1-2, and a frequency of 300 kHz. The as-deposited films were amorphous and required an annealing temperature of 750° C. for 1 hour to bring down the resistivity to 20 micro-ohms-cm; the as-deposited PECVD titanium silicide films were reported to be smooth.

Gupta et al used an excimer laser (ArF, 193nm) with a focused cross-sectional area of 15×1 mm to investigate the Laser-Induced CVD of titanium silicide. This is a gas phase reaction process that is initiated photochemically. The laser beam was passed 2 mm above the wafer surface. They were able to deposit titanium silicide films at substrate temperatures above 350° C. The as-deposited films had high resistivities and were mostly amorphous, and required an annealing temperature of 650°–700° C. to reduce the resistivity to 20–30 micro-ohms-cm. The films were also contaminated with oxygen (detected by Auger) and chlorine (detected by RBS). Increasing the substrate deposition temperature resulted in rough silicide films; however, the silicide adhesion improved.

Tedrow et al., *Appl. Phys. Lett.* 1, 1985, report in-situ deposition of sequential films of polysilicon and titanium silicide wherein the as-deposited films had resistivities of 22–39 micro-ohms-cm from LPCVD of $SiH_4$ and $TiCl_4$. They report that:

"Deposition of polysilicon prior to the deposition of the silicide film has two advantages. Firstly, a polycide (polysilicon-silicide layered structure) film is obtained which preserves the nearly ideal Metal-Oxide-Semiconductor (MOS) characteristics of the underlying polysilicon; and secondly, the underlying polysilicon film provides a clean interface for the titanium silicide deposition."

Bouteville et al., *J. Electrochem. Soc.* 134(8), 2080 (1987), is the only known reported LPCVD work on the selective deposition of $TiSi_2$. They use hydrogen reduction of titanium tetrachloride ($TiCl_4$) in a temperature range of 700°–1000° C. and a total pressure of 100 Pa (0.75 Torr) to selectively deposit titanium on the silicon regions and form titanium silicide through silicon diffusion in the growing titanium film. However, their selective deposition process is not compatible with the fabrication of shallow junctions since the silicide is formed by supplying the silicon from the substrate. The resistivity of their titanium silicide films is high, 40–100 micro-ohms-cm, and they also refer to nucleation problems in the formation of titanium silicide films.

Consequently, despite extended efforts over a number of years by numerous scientists, a need still exists for an LPCVD selective $TiSi_2$ deposition process which does not rely completely on supplying the silicon from the substrate and which reliably selectively produces high conductivity or low resistivity films.

DISCLOSURE OF THE INVENTION

This invention relates to a process and apparatus for the Very Low Pressure Chemical Vapor Deposition (VLPCVD) of selective and/or blanket polycrystalline refractory titanium silicide ($TiSi_2$) in a reactor.

The starting reactants for the process are a gaseous silicon halide, such as silane ($SiH_4$) and a gaseous titanium halide, such as $TiCl_4$.

The reactants flow through a very low pressure chemical vapor deposition (VLPCVD) reactor comprising a cold wall chamber with a low thermal mass susceptor in which a substrate is radiantly heated by infra-red (IR) lamps.

First, polysilicon is deposited from the silicon halide at a substrate temperature of about 600° C. Shortly before ending the polysilicon deposition, i.e., about 30 seconds, the substrate temperature is adjusted to 730° C. in preparation for subsequent silicide deposition. With an optimum silicon halide/titanium halide flow rate of 20/2 and total pressure of 67 mTorr; a low resistivity titanium silicide film is then formed on the polysilicon.

Since the primary silicon source for the reaction is silane, the process minimizes the consumption of the underlying silicon and is thus compatible with modern fabrication technologies. The reaction can be made selective, in the sense that deposition of the silicide only occurs on the silicon surface of an oxide patterned silicon wafer. For such selective deposition to occur, a very thin, (i.e., about 0.035–0.04 micron) in-situ VLPCVD of polysilicon from the gaseous silicon halide is made over the entire wafer, leaving underlying silicon regions and oxide regions. The thin polysilicon layer is formed immediately prior to the titanium silicide deposition. The silicide nucleates on the thin polysilicon layer over both the silicon region and the oxide region. But, depending upon both the titanium silicide deposition time and the earlier polysilicon deposition time, the thin polysilicon layer will be etched and/or consumed over the oxide regions. When the polysilicon is consumed over the oxide regions, no further growth of titanium silicide occurs over the exposed oxide regions, since there is no more polysilicon to supply the silicon. Also, to the extent some thin titanium silicide is initially formed over the oxide regions, it has poor adhesion and flakes off. Once a continuous titanium silicide film is formed on the silicon regions, the silicon in the silicide film is supplied completely by the silane; whereas the titanium silicide film continues to grow over the silicon regions due to the presence of the underlying silicon. In other words, after continuous titanium silicide film is formed on the silicon regions, the remaining silicon in the silicon regions is no longer consumed, since the silicon for the further formation of titanium silicide is primarily supplied by the silicon in the silane.

An optimum deposition time exists for selective deposition of $TiSi_2$ on Si regions of oxide patterned Si wafers; and decreasing the silicide deposition time improves the selectivity of the optimized process.

BEST MODE OF CARRYING OUT THE INVENTION

Figure 1:
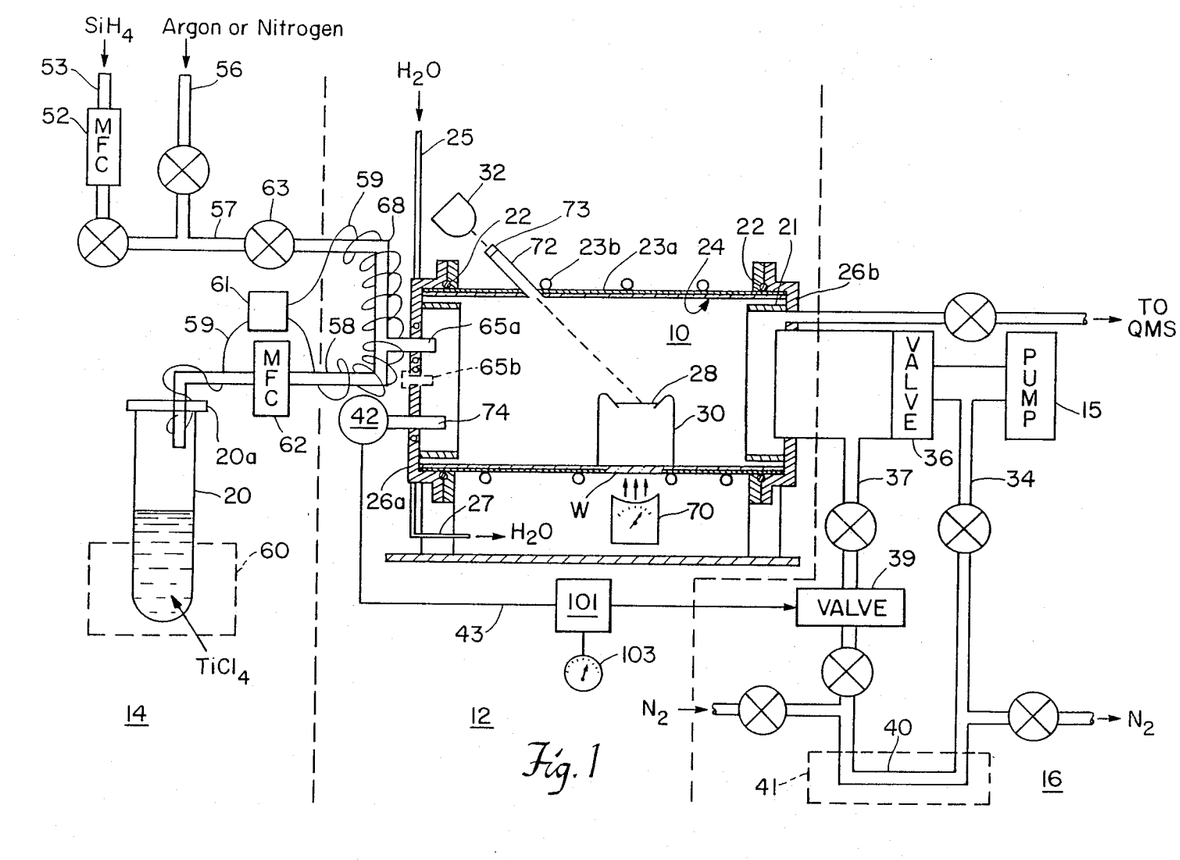
FIG. 1 is a schematic diagram of the reactor system of the invention.

Referring now to FIG. 1, a preferred embodiment invention will now be described in connection therewith.

The reactor system is a Very Low Pressure CVD (VLPCVD) reactor system for producing titanium silicide films from silicon halide reactants, i.e, silane (SiH$_4$) as a silicon source and titanium halides (TiCl$_4$) as a titanium source.

The VLPCVD reactor system of FIG. 1 consists of a gas distribution system 14, a reaction chamber, and heating system 12, and a pumping system 16. Research purity gases (less than 0.1 ppm each of O$_2$, H$_2$O, etc.) from gas reservoirs (not shown), are supplied at the various inlets shown in FIG. 1. The gas flows (except for the backfill gas) are controlled by mass flow controllers (MFC) 52 and 62. The available gases are silane, nitrogen, argon and TiCl$_4$.

Nitrogen is introduced at line 56 to backfill the chamber 10 after a deposition is completed. TiCl$_4$ is stored in a standard Pyrex bubbler 20. The Pyrex bubbler containing the TiCl$_4$ is immersed in a 50° C. temperature bath 60 to keep its temperature and thus its vapor pressure constant. The flow of the TiCl$_4$ vapor to the chamber 10 is controlled by MFC 62.

All the conduits from the TiCl$_4$ reservoir to the chamber 10 are heated by a resistance tape 59 connected to an electrical source 61. In this manner, the temperature of the conduits is maintained higher than the bath temperature to keep the TiCl$_4$ vapor from condensing. SiH$_4$ is delivered from inlet tube 53 through MFC 52, conduit 57 and valve 63. Three port junction 65a is coupled to flange 26a and to the lines 68 and 58 from the valve 63 and MFC 62, respectively. The SiH$_4$ and TiCl$_4$ can be delivered to the chamber either pre-mixed or separately, as desired. For pre-mixing, three port junction 65a is used as shown. For separate connection, alternate port 65b shown in dotted lines in FIG. 1, is connected to one of the lines 58 or 68.

The chamber 10 consists of a quartz tube 24 (155 mm OD, 508 mm long) sealed to stainless steel flanges 26a and 26b at each end by Teflon coated Viton gaskets 22. Radiation shields 21 are attached inside flanges 26a and 26b adjacent to gaskets 22 to minimize heat damage to the gasket seals. A copper sheet 23a surrounds the chamber 10 to contain the un-absorbed radiation from the IR heater 70. The sheet 23a has copper tubing 23b soldered over its surface. A flow of cold water H$_2$O through the tubing keeps the sheet 23a from getting too hot. Cold water H$_2$O is also introduced through an inlet port 25 through passageways in flanges 26a and 26b to outlet port 27 to further minimize heat damage to the gaskets. A single wafer 28 sits on a quartz holder 30 and is supported around its periphery by quartz pins. A radiant heater 70 (6×6 KW infrared lamps) positioned outside and adjacent the chamber 10 directly heats the wafer 28 by radiation from below through window W. The wafer temperature (calibrated using a thermocouple embedded in a dummy wafer) is monitored by an infrared pyrometer 32 through a sapphire window 73 at the end of transparent viewing tube 72 in a wall of the reactor.

To prevent any ambiguities in the exact wafer temperature, such as the pyrometer detecting the radiation from both the lamps and the wafer, a pyrometer with a center wavelength of 5.1 μm is used. A sapphire window 73, through which the pyrometer detects the wafer radiation, is incorporated in the reaction chamber. This sapphire window allows the transmission of the 5.1 μm wafer radiation while the quartz tube 24 blocks the 5.1 μm radiation from the lamps; this arrangement allows the pyrometer to detect the radiation from the wafer only. The wafer temperature is calibrated against the lamp voltage using a type K thermocouple (not shown). The thermocouple is fed through two laser drilled holes at the center of the wafer, with good thermal contact between the thermocouple bead and the wafer assured by using a high temperature cement having a high thermal conductivity. The wafer 28 is supported around its periphery by four quartz pins; this susceptor design provides for a small thermal mass and facilitates abrupt changes in the wafer temperature which is desirable when sequentially depositing different materials at different temperatures in the reactor.

Note that the apparatus as thus far described is particularly adapted for processing silicon wafers while maintaining the reactor walls cold. The heating of the wafer 28 is accomplished by lamps in IR heater 70 which emit light waves of a frequency which are absorbed by silicon; so that the silicon is appropriately heated. The window W of the quartz envelope 24 of the reactor 10 is substantially transparent to the IR radiation and remains cool.

Water cooling is provided so that the copper shield 23a, which absorbs any stray radiation, can be kept cold.

The chamber is pumped on by a turbomolecular pump 15. The system base pressure in the reactor is established at less than or equal to about $10^{-7}$ Torr by pumping out the chamber 10 with pump 15 prior to deposition. A gate valve 36 isolates the chamber 10 from the turbomolecular pump 15. In addition, a line 37 bypassing the gate valve 36 and containing a butterfly pressure controlling valve 39 and a cold trap 40 in series, is incorporated into the pumping system 16.

The pressure of the chamber is monitored by a capacitance manometer 42 coupled to a monitor tube 74 provided in the flange 26a. An electronic feedback loop 43, controlled by the setting of control unit 101 in response to manual operator control dial 103, positions the setting of butterfly valve 39 to automatically control the valve setting and hence the chamber pressure.

A cold trap 40 is immersed in a −60° C. bath 41 to freeze out any unreacted TiCl$_4$ from the reactor before it reaches the pump 15 while allowing unreacted SiH$_4$ to be pumped out.

Before making a deposition, a wafer 28 is cleaned in a 5:1 sulfuric acid:hydrogen peroxide solution followed by a deionized water rinse and nitrogen dry. The wafer is then treated in a UV ozone cleaning system to volatilize any residual carbon on the wafer surface. Flange 26a is removed and the wafer 28 is loaded on the quartz holder 30 where it is suspended so that the bottom surface of the wafer is directly exposed to radiant heater 70. The flange 26a is secured and the chamber 10 is pumped down. Next, heater 70 is turned on to bake out the chamber 10. Concurrently, the chamber 10 and the bypass line 37 are continuously purged with argon to obtain a hot base pressure in the 10$^{-7}$ Torr range and thereby to provide an oxygen and moisture free environment.

The gate valve 36 is closed and the pressure of 90 mTorr at which the polysilicon deposition is to be performed is established by closing the butterfly valve 39 by an appropriate amount while SiH$_4$ is introduced into the chamber from line 53. This is accomplished by dialing in the desired pressure on control unit 101 at the time the silane is introduced into chamber 10. The control unit 101 controls the pressure in the chamber 10 comparing the sensed pressure from manometer 42 and moving the position of butterfly valve 39 in a direction which will bring the pressure to the setting of dial 103.

Thus, a desired layer thickness of polysilicon is deposited on the wafer 28, by flowing SiH$_4$ in the chamber 10 for a given period of time and at the predetermined temperature (about 630° C.) and pressure, i.e., about 90 mTorr or less.

Next, the chamber pressure (50–460 m Torr) and the wafer temperature (730° C.) is established for the titanium silicide deposition. The cold trap 40 is immersed in a −60° C. bath 41. Then the MFC 62 is set to establish a desired flow of TiCl$_4$ into the chamber.

Experimental Blanket TiSi$_2$ Polysilicon

Optimum silicide deposition 100 mm Si polysilicon wafer with a 1000 Å thermal oxide, as shown in Table I below, were achieved through a careful characterization of the as-deposited titanium silicide films. This optimization required measuring the following parameters: resistivity, impurity incorporation into the films, thicknesses of the silicide and the underlying polysilicon layers, crystallinity and the phase(s) of the as-deposited silicide films, surface morphology, grain size, the width of the transition region between the silicide and polysilicon, and the Si/Ti ratio in the films.

TABLE I

| | Deposition Conditions | |
|---|---|---|
| | Polysilicon | Titanium Silicide |
| Temperature (°C.) | 600 | 730 |
| SiH$_4$ Flow (sccm) | 40 | 10–40 |
| TiCl$_4$ Flow (sccm) | — | 1–10 |
| Pressure (mTorr) | 90 | 45–100 |
| Duration (min) | 30 | 1.20 |
| Thickness (μm) | 0.25 | 0.18–≧1 |

The results of experiments designed to determine the dependence of the silicide film properties on the deposition parameters are presented below.

Effects of Varying TiCl$_4$ and SiH$_4$ Partial Pressures

The effects of varying the TiCl$_4$ partial pressure on the silicide film properties at a constant silane flow rate of 40 sccm are summarized in Table II, as follows:

TABLE II

Effects of Varying TiCl$_4$ Partial Pressure on the Film Properties for a SiH$_4$ Flow of 40 sccm, a Total Pressure of 94 mTorr, and a Deposition Temperature of 730° C.

| SiH$_4$/TiCl$_4$ | Appearance | Resistivity (micro-ohms-cm) | Crystallinity | Phases | Si/Ti |
|---|---|---|---|---|---|
| 40/2 | filament growth | — | — | — | — |
| 40/3 | ~ specular | 100–175 | polycrystalline | C54 TiSi$_2$ | 1.7 |
| 40/4 | rough | 89–102 | polycrystalline | C54 TiSi$_2$ | 1.7 |
| 40/5 | rough | 87 | polycrystalline | C49 TiSi$_2$ C54 TiSi$_2$ | 1.7 |
| 40/6 | flaked | — | — | — | — |

The deposition temperature and total pressure for these experiments are 730° C. and 94 mTorr, respectively. As shown in Table II, this set of deposition conditions results in rough, high resistivity films. Filament growth occurs at a TiCl$_4$ flow of 2 sccm corresponding to a TiCl$_4$ partial pressure of 4.5 mTorr. In this undesirable growth mode, the stem of the whisker is silicon while the tip (which catalyzes the filament growth) is metastable C49 titanium silicide. Increasing the TiCl$_4$ flow rate from 2 sccm results in films that are stable C54 polycrystalline titanium silicide, with a Si/Ti ratio of about 1.7. The surface roughness is responsible for at least a portion of the high resistivities measured for these films; no other silicide phases are detected in these films (except for the TiCl$_4$ flow of 5 sccm) to account for the high resistivity. A TiCl$_4$ flow of 6 sccm (corresponding to a TiCl$_4$ partial pressure of 12.3 mTorr) results in the flaking of the film.

Another similar set of experiments were carried out at a constant silane flow rate of 20 sccm. The film properties for this set of deposition conditions at 730° C. and 67 mTorr are shown in Table III.

TABLE III

Effects of Varying TiCl$_4$ Partial Pressure on the Film Properties for a SiH$_4$ Flow of 20 sccm, a Total Pressure of 67 mTorr, and a Deposition Temperature of 730° C.

| SiH$_4$/TiCl$_4$ | Appearance | Resistivity (micro-ohms-cm) | Crystallinity | Phases | Si/Ti |
|---|---|---|---|---|---|
| 20/1.5 | filament growth | — | — | — | — |
| 20/2 | specular | 15–20 | polycrystalline | C54 TiSi$_2$ | 2.1 |
| 20/3 | slightly rough | 125–195 | polycrystalline | C54 TiSi$_2$ | 1.7 |
| 20/4 | rough | 330 | polycrystalline | C49 TiSi$_2$ C54 TiSi$_2$ | 2 |

Filament growth occurs at a TiCl$_4$ flow of 1.5 sccm corresponding to a TiCl$_4$ partial pressure of 4.7 mTorr. Increasing the flow of TiCl$_4$ to 2 sccm (equivalent to a TiCl$_4$ partial pressure of 6.1 mTorr) results in a specular, low resistivity (15–20 micro-ohms-cm), polycrystalline C54 titanium silicide film with a Si/Ti ratio of 2.1. It is significant that the as-deposited film has a low resistivity and does not require a post-deposition anneal. Increasing the flow of TiCl$_4$ further to 3 and 4 sccm (i.e., 8.7 and 11.2 mTorr, respectively) results in rougher films having higher resistivities. At this deposition temperature, all films are polycrystalline and have a Si/Ti ratio of about 2. The film with a SiH$_4$/TiCl$_4$ of 20/4 has the C49 phase in addition to the C54 phase; this additional mestastable phase partially contributes to the high resistivity of this film.

SEM micrographs of the films presented in Table III show that the film with a SiH$_4$/TiCl$_4$ of 20/2 has the smoothest surface morphology, while increasing the TiCl$_4$ flow to 3 and 4 sccm results in rougher films with the 20/4 ratio film being discontinuous (which also results in a higher resistivity for this film). Increasing the flow of TiCl$_4$ from 2 to 4 sccm also increases the grain size.

The silicide films have a uniform composition except for a transition region between the polysilicon and the titanium silicide layers. The resistivities reported here for these titanium silicide layers include the width of the transition region in the calculations, resulting in higher resistivity values than if the transition region thickness is not included. For instance, in Table III, the resistivity for the 20/2 film is recorded as 15–20 micro-ohms-cm; the value of 20 micro-ohms-cm includes the width of the transition region while the value of 15 $\mu\Omega$-cm excludes this width in the resistivity calculation. The higher values of resistivity for rougher films are additionally due to the presence of voids at the grain boundaries (20/3 film) and the presence of other silicide phases (20/4 film).

Effects of Varying Total Pressure

For this set of experiments, the SiH$_4$/TiCl$_4$ ratio is held constant at 10, and the total pressure is varied from 45 to 100 mTorr. The total pressure is varied by adjusting the SiH$_4$ and TiCl$_4$ flow rates The results are summarized in Table IV below:

TABLE IV

Effects of Varying Total Pressure on the Film Properties for a SiH$_4$/TiCl$_4$ Flow Rate Ratio of 10 and a Deposition Temperature of 730° C.

| SiH$_4$/TiCl$_4$ | Pressure (mTorr) | Appearance | Resistivity (micro-ohms-cm) | Crystallinity | Phases | Si/Ti |
|---|---|---|---|---|---|---|
| 10/1 | 50 | filament growth | — | — | — | — |
| 20/2 | 67 | specular | 15–20 | polycrystalline | C54 TiSi$_2$ | 2.1 |
| 40/4 | 94 | rough | 89–102 | polycrystalline | C54 TiSi$_2$ | 1.7 |

It is observed that the total pressure, which is composed of the partial pressures of SiH$_4$ and TiCl$_4$, is important in determining the quality of the as-deposited titanium silicide films. As shown in Table IV, at a pressure of about 50 mTorr and a SiH$_4$/TiCl$_4$ ratio of 10, filament growth occurs. Increasing the pressure to about 67 mTorr results in specular, low resistivity (15–20 micro-ohms-cm) films, while further increasing the pressure to about 94 mTorr results in rough films. If the SiH$_4$/TiCl$_4$ ratio is changed to about 6.7, a different set of results are obtained (see Table V):

TABLE V

Effects of Varying Total Pressure on the Film Properties for a SiH$_4$/TiCl$_4$ Flow Rate Ratio of 6.7 and a Deposition Temperature of 730° C.

| SiH$_4$/TiCl$_4$ | Pressure (mTorr) | Appearance | Resistivity (micro-ohms-cm) | Crystallinity | Phases | Si/Ti |
|---|---|---|---|---|---|---|
| 10/1.5 | 50 | specular and filament growth | 18–33 | polycrystalline | C54 TiSi$_2$ | 4 |
| 20/3 | 67 | slightly rough | 124–195 | polycrystalline | C54 TiSi$_2$ | 1.7 |
| 40/6 | 94 | flaked | — | — | — | — |

In this case, a pressure of about 50 mTorr results in a specular film partially covered by whiskers. Increasing the pressure further results in rough films. Thus, the ratio of the SiH$_4$/TiCl$_4$ flow rates in conjunction with the total pressure is important in determining the quality of the as-deposited silicide films. The best quality film is still the SiH$_4$/TiCl$_4$ ratio of 20/2 at a pressure of 67 mTorr.

Deposition Rate

Figure 2:
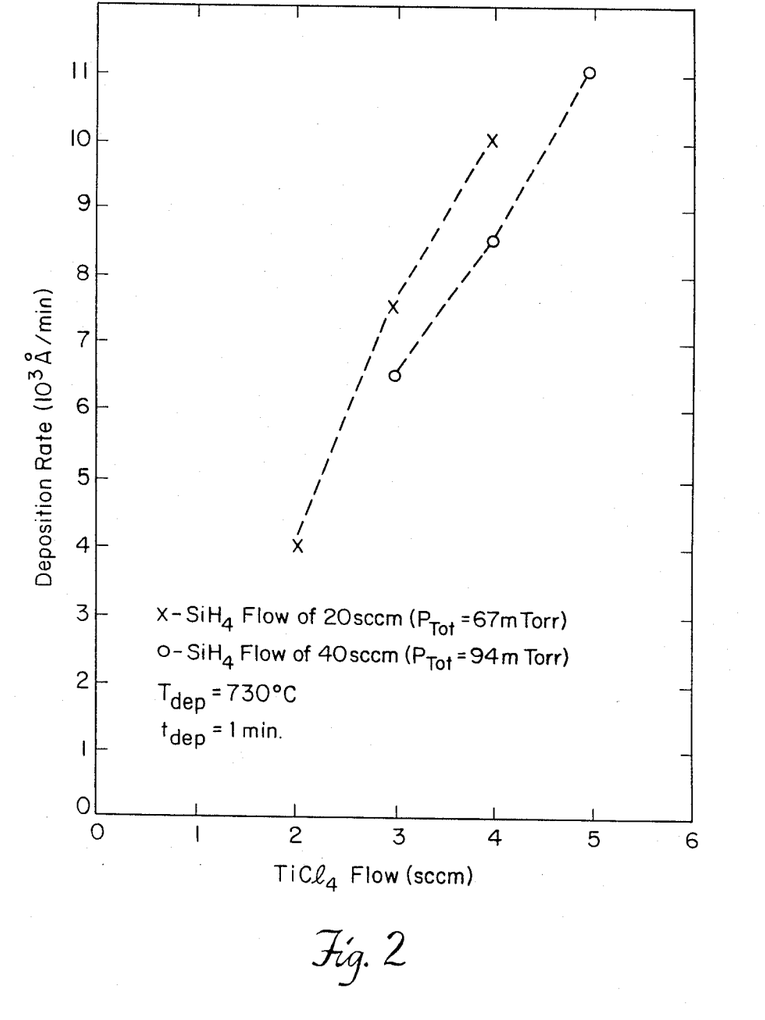
FIG. 2 Deposition rate versus $TiCl_4$ flow rate for constant $SiH_4$ flow rates of 20 and 40 sccm (total pressures of 67 and 94 mTorr, respectively), a deposition temperature of 730° C., and a deposition time of 1 min.

FIG. 2 presents the initial deposition rate as a function of the TiCl$_4$ flow rate for constant SiH$_4$ flow rates of 20 and 40 sccm and a deposition time of 1 minute. The deposition rates presented in this figure include the width of the transition region in the total titanium silicide film thickness. From FIG. 2 it can be observed that the deposition rate changes rapidly with increasing TiCl$_4$ flow. This change in the deposition rate is partially due to the polysilicon consumption rate at this deposition time. FIG. 2 also shows that the deposition rate decreases with increasing SiH$_4$ flow for the same TiCl$_4$ flow.

Polysilicon Consumption

Figure 3:
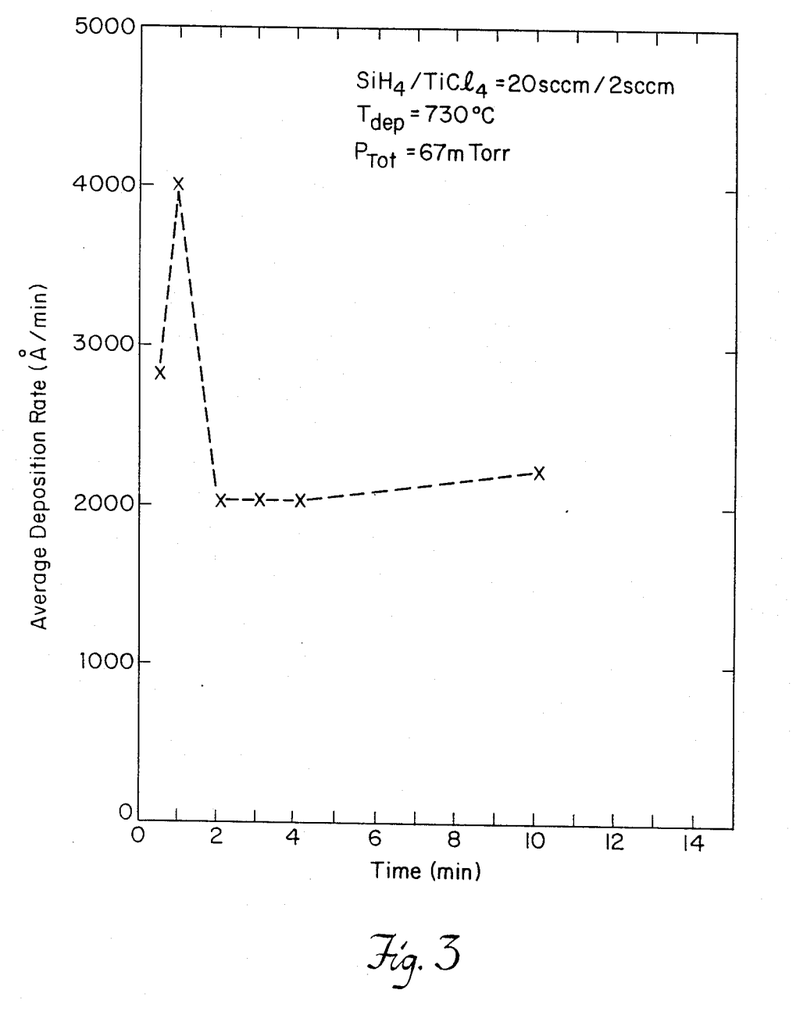
FIG. 3 Average deposition rate versus deposition time for the 20/2, 730° C., 67 mTorr deposition condition.

During the experiments it was observed that titanium silicide does not nucleate on a silicon surface covered by native oxide; a clean silicon surface is required for the nucleation. Thus, to deposit LPCVD titanium silicide it is necessary to in-situ deposit a polysilicon layer prior to the silicide deposition. Once the silicide deposition commences, some of the underlying polysilicon layer is consumed. To quantify the polysilicon consumption rate, silicide films were deposited at varying deposition times for the same conditions of pressure, temperature, and $SiH_4/TiCl_4$ flow rate ratios. FIG. 3 shows a plot of the average deposition rate (total film thickness divided by time) versus time for the deposition condition of 20/2, 730° C., and 67 mTorr. Initially the deposition rate is high, and as the deposition time is increased, the average deposition rate drops to a constant value of about 2000 Å/minute. The rate of polysilicon consumption at the beginning of the titanium silicide deposition can be deduced from this plot by subtracting the steady-state deposition rate from the initial deposition rate yielding a consumption rate of about 2000 Å/minute. This consumption rate still includes the width of the transition region, without which the consumption rate reduces to about 900 Å/minute. As the deposition time increases, the polysilicon consumption rate rapidly decreases.

Figure 4:
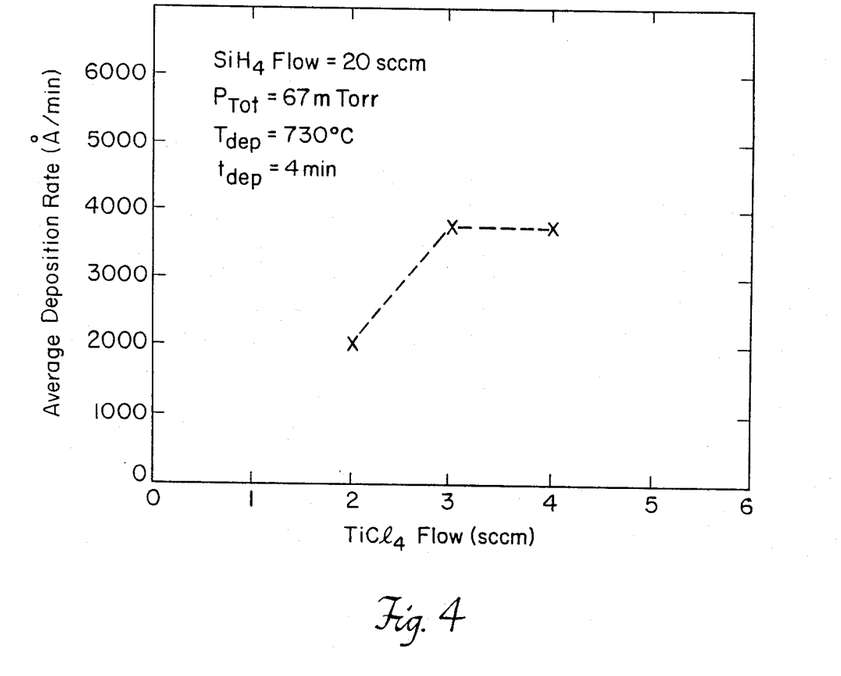
FIG. 4 Average deposition rate versus TiCl$_4$ flow rate for a deposition time of 4 min, a SiH$_4$ flow of 20 sccm, a total pressure of 67 mTorr, and a deposition temperature of 730° C.
Figure 5:
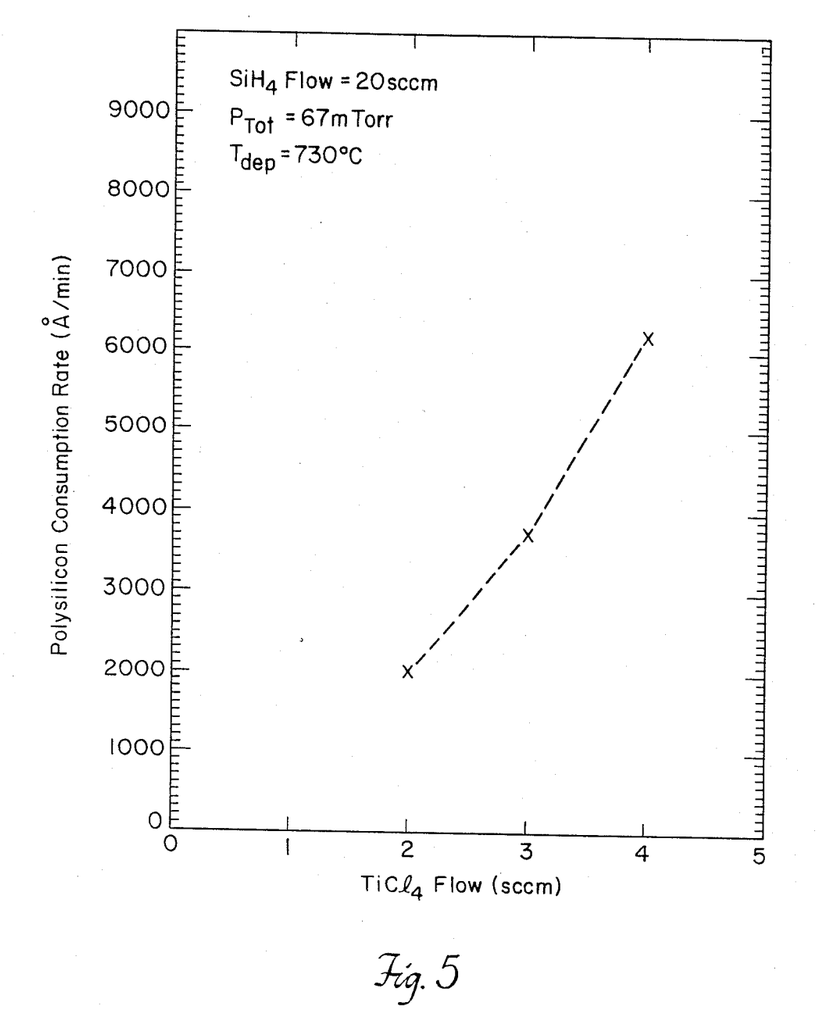
FIG. 5 Polysilicon consumption rate at the beginning of the deposition versus TiCl$_4$ flow for a constant SiH$_4$ flow of 20 sccm, a total pressure of 67 mTorr and a deposition temperature of 730° C.

FIG. 4 shows the average deposition rate versus $TiCl_4$ flow rate for a deposition time of 4 minutes and a $SiH_4$ flow of 20 sccm. Assuming that negligible polysilicon consumption occurs after 1 minute, then from FIGS. 2 and 4 the polysilicon consumption rate can be extracted at the start of the silicide deposition (see FIG. 5). Auger data for the 2 sccm film confirm the consumption rate in FIG. 5. The assumption of negligible polysilicon consumption after 1 minute is reasonable considering that the silicide film does not flake for extended deposition durations. In addition, the barrier to silicon diffusion created by the growing titanium silicide film is expected to decrease the polysilicon consumption rate. From FIG. 5 it can be deduced that increasing the flow of $TiCl_4$ to 3 and 4 sccm while keeping the $SiH_4$ flow constant at 20 sccm increases the polysilicon consumption rate at the start of the silicide deposition. In all cases, once the polysilicon layer is completely consumed, the titanium silicide flakes and the underlying silicon dioxide layer is exposed. It is believed that the flaking of the titanium silicide film from the silicon dioxide layer is due to poor adhesion/chemical bonding between these two layers in conjunction with different thermal expansion coefficients; similar observations have been made for tantalum silicide.

Investigation of the dependence of polysilicon consumption and deposition rates on the $TiCl_4$ flow rate requires a brief review of the deposition chemistry. The reactions listed in this section are all thermodynamically favorable at 730° C. The overall proposed reaction at the start of the titanium silicide deposition can be written as follows:

$$TiCl_4(g) + 2SiH_4(g) + Si(s) \rightarrow TiSi_2(s) + SiClH_3(g) + 3HCl(g) + H_2(g) \quad (1)$$

where Si(s) represents the consumption of polysilicon at the start of the silicide deposition. The increase of the polysilicon consumption rate with increasing $TiCl_4$ flow rate requires a close examination of the primary reactions responsible for the consumption of the polysilicon. These reactions are listed below:

$$TiCl_2^* + 3Si(s) \rightarrow TiSi_2(s) + SiCl_2(g) \quad (2)$$

$$TiCl_2^* + 4Si(s) + 3H_2^* \rightarrow TiSi_2(s) + 2SiClH_3(g) \quad (3)$$

$$TiCl_4^* + 3Si(s) \rightarrow TiSi_2(s) + SiCl_4(g) \quad (4)$$

$$Si(s) + 3HCl^* \rightarrow SiCl_3H(g) + H_2(g) \quad (5)$$

$$Si(s) + 3HCl^* \rightarrow SiCl_3(g) + 3/2H_2(g) \quad (6)$$

$$Si(s) + 2HCl^* \rightarrow SiCl_2H_2(g) \quad (7)$$

where * denotes adsorption on a surface site and $TiCl_2^*$ and $HCl^*$ are generated by intermediate reactions. Increasing the flow of $TiCl_4$ from 2 to 4 sccm increases the $TiCl_4$ flux to the surface. Since $TiCl_4$ decomposes as $TiCl_2$ and HCl in the presence of $H_2$ (generated by $SiH_4$ decomposition)

$$TiCl_4^* + H_2^* \rightarrow TiCl_2^* + 2HCl(g), \quad (8)$$

increasing the flux of $TiCl_4$ to the surface will increase the partial pressures of $TiCl_2$ and HCl species at the surface. From the above reactions, it is evident that an increase in both $TiCl_2$ and HCl will increase the forward reaction rates, and hence result in an increase in the polysilicon consumption Once the polysilicon consumption rate has diminished, the overall reaction reduces to the following reaction:

$$TiCl_4(g) + 3SiH_4(g) \rightarrow TiSi_2(s) + SiClH_3(g) + 3HCl(g) + 3H_2(g). \quad (9)$$

Some of the chemical reactions (1)–(9) are based on the by-products experimentally detected by a QMS. The following silicon-chlorine-hydrogen by-products were detected during the titanium silicide depositions: SiCl, $SiCl_2$, $SiCl_3$, $SiClH_3$, $SiCl_2H_2$, $SiCl_3H$, and HCL. The signals for the titanium-chlorine species were not detected because of the low partial pressures of these species. One would expect that the SiCl, $SiCl_2$, and $SiCl_3$ signals are due to the decomposition of $SiCl_4$ in the QMS ionization chamber; however, $SiCl_4$ was not detected during the depositions.

Figure 6:
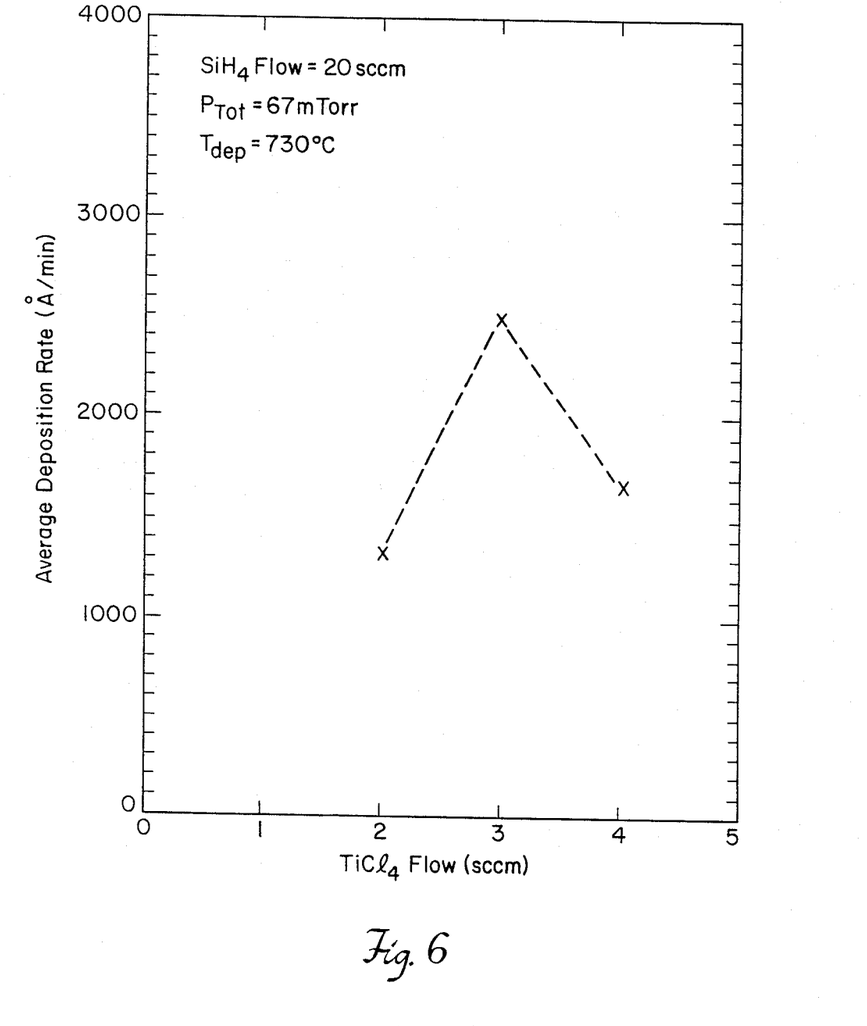
FIG. 6 Average deposition rate versus TiCl$_4$ flow rate for a constant SiH$_4$ flow of 20 sccm, a total pressure of 67 mTorr, and a deposition temperature of 730° C.

FIG. 6 is a plot of the average deposition rate ([Thickness$_{4\ min}$ − Thickness$_{1\ min}$] ÷ 3 min) versus $TiCl_4$ flow rate for a constant $SiH_4$ flow of 20 sccm. The increase in the deposition rate for increasing the flow of $TiCl_4$ from 2 to 3 sccm could be explained by considering the following reactions:

$$SiH_2^* + 2HCl(g) \rightarrow SiCl_2^* + 2H(g) \quad (10)$$

$$(n+1+m)H_2(g) + nSiCl_2^* \rightarrow TiCl_2^* \rightarrow TiSi_2(s) + (2n+2-m)HCl(g) + mSiClH_3(g) \quad (11)$$

where m and n are integers and $SiH_2$ is an intermediate reaction by-product. Increasing the flux of $TiCl_4$ to the surface by increasing the flow of $TiCl_4$ results in a higher concentration of HCl and $TiCl_2$ at the surface.

Both of these increased concentrations will increase the forward reaction rates of (10) and (11), and thus enhance the deposition rate. The decrease in the average deposition rate for the TiCl$_4$ flow of 4 sccm could be due to the different nature of the surface, with respect to the other films, during the film growth. For instance, after one minute deposition, the metastable C49 phase was detected in this film and the film was discontinuous. Adsorption site blocking due to the high surface coverage of Cl and H at this TiCl$_4$ flow could be responsible for the discontinuity in the film by reducing the density of available nucleation sites For the case of constant TiCl$_4$ flow but different SiH$_4$ flow, no definite statement can be made regarding the dependence of the deposition rate on the SiH$_4$ flow; the data for the average deposition rate are not available due to the film's flaking under several of the extended duration deposition conditions. It is believed that the decrease in the average deposition rate versus SiH$_4$ flow for a constant TiCl$_4$ flow (see FIG. 2) could be due to the occupation of the active adsorption sites by H$_2$ and SiH$_2$, consequently decreasing the adsorption of TiCl$_4$ on the surface.

Selective Deposition

Selective deposition of the silicide is dependent on both the silicide and the polysilicon deposition times. Tables VI and VII, below, summarize the results for polysilicon and the oxide patterned wafers, respectively.

TABLE VI

Polysilicon and Titanium Silicide Deposition Times for Patterned Polysilicon Wafers Along with the Resulting Film Properties.

| Poly. Silicon $t_{dep}$ (min) | Titanium Silicide $t_{dep}$ (min) | Film Properties | | |
|---|---|---|---|---|
| | | Thickness (Å) | Resistivity (micro - ohms - cm) | Comments |
| 5 | 1 | 5000 | 85 | blanket |
| 3 | 1 | 5000 | 90 | blanket |
| 1.5 | 1 | 2800 | 140 | semi-selective |
| 1 | 1 | 2500 | 25 | blanket |
| 1 | 2 | 3500 | 25 | blanket |
| 1.5 | 0.5 | 1800 | — † | selective |

† Selective deposition prevented measurement of sheet resistance.

Figure 7A:
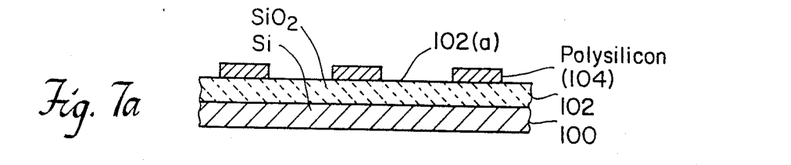
FIGS. 7a-c depict cross-sections of a Si substrate with an oxide layer upon which polysilcon patterns are formed (7a) and upon which polysilicon pattern titanium silicide is selectively deposited (7c).

The starting substrates for the patterned polysilicon wafers of Table VI are shown in cross-section in FIG. 7a to comprise a silicon wafer 100 upon which an SiO$_2$ oxide layer 102 is thermally grown. A polysilicon layer is deposited on the SiO$_2$ layer 102. The polysilicon layer is etched down to the SiO$_2$ layer leaving a pattern of exposed polysilicon regions 104 and oxide regions 102(a).

Figure 7B:
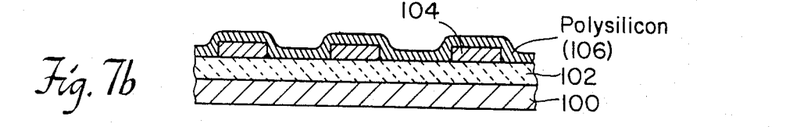
Figure 7C:
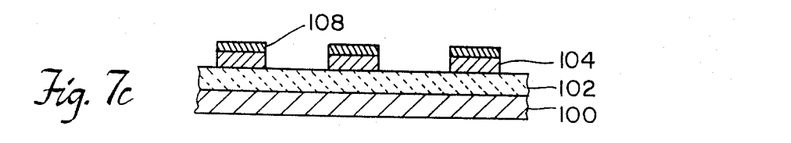

Next, as shown in FIG. 7b, a polysilicon layer 106 is deposited over the patterned wafer from SiH$_4$ at a 600° C. substrate temperature, as described in connection with FIG. 1. The substrate temperature is adjusted to 730° C. shortly before the end of the polysilicon deposition and titanium silicide deposited from a flow of SiH$_4$ and TiCl$_4$, as also described in connection with FIG. 1. Depending upon the deposition conditions (See Table VI), the TiSi$_2$ 108 can be made to deposit only on the polysilicon regions 104 and not on the SiO$_2$ regions 102(a), as shown in FIG. 7c.

Figure 8A:
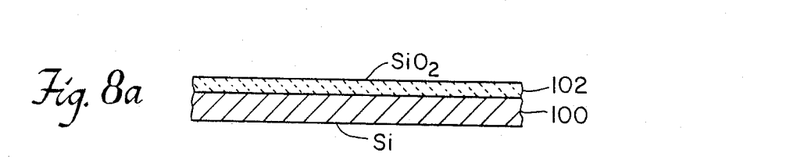
FIGS. 8a-d depict cross-sections of a Si substrate upon which oxide patterns are formed (8b) and upon which titanium silicide is formed in the Si regions between the oxide patterns (8d).
Figure 8B:
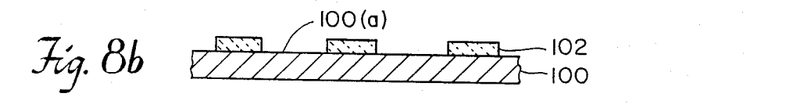
Figure 8C:
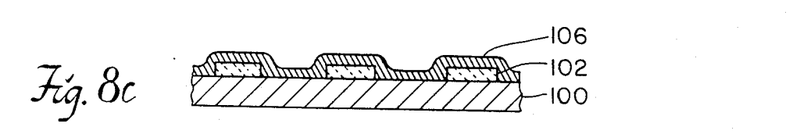
Figure 8D:
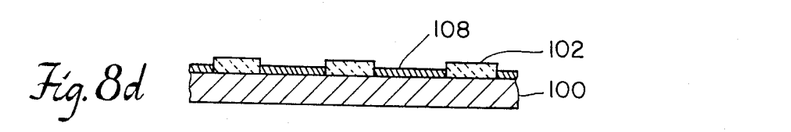

The starting structure for the patterned oxide wafers is shown in FIGS. 8a–8b. An oxide (SiO$_2$) layer 102 is formed on Si wafer 100 and the oxide is patterned, as by etching, into regions of exposed oxide 102 and exposed silicon 100a. A polysilicon layer 106 as previously described is then formed by VLPCVD over the respective oxide and silicon regions (See FIG. 8c). Depending upon the conditions set forth in Table VII, below, selective deposition of TiSi$_2$ 108 can be made to occur only over the Si regions 100a (See FIG. 8d).

TABLE VII

Polysilicon and Titanium Silicide Deposition Times for Patterned Oxide Wafers Along with the Resulting Film Properties.

| Poly. Silicon $t_{dep}$ (min) | Titanium Silicide $t_{dep}$ (min) | Film Properties | | |
|---|---|---|---|---|
| | | Thickness (Å) | Resistivity (micro - ohms - cm) | Comments |
| 1.5 | 1 | 2000 | 20 | blanket |
| 1.5 | 0.5 | 2000 | 36 | blanket |
| 1 | 0.5 | 1300 | 102 | semi-selective |
| 1 | 0.33 | 500 | — † | selective |
| 0.67 | 0.33 | 700 | — † | selective |

† Selective deposition prevented measurement of sheet resistance.

The terminology in these tables are as follows: "blanket" refers to a uniform deposition over the oxide and the silicon regions, semi-selective refers to a very thin deposition on the oxide with a thicker deposition on the silicon regions, and selective refers to deposition on the silicon region with only scattered residue on the oxide. Tables VI and VII list the resistivities only for the blanket and the semi-selective titanium silicide films. The sheet resistance measurements were not possible for the selective films since there are no large regions on the patterned wafers to accommodate the four probes of the four-point probe and there is no silicide film on the oxide region to allow the measuring of the average sheet resistance. The thickness measurements for entries in Table VI revealed that the blanket depositions for the 5 and 3 minutes polysilicon depositions (the first two entries in Table VI) are not uniform over the polysilicon and oxide regions. This difference in thicknesses affects the accuracy of the sheet resistance measurement in these films since the four-point probe is measuring an average sheet resistance of two resistors in series. Considering the difference in thicknesses over these two regions in conjunction with the measured average sheet resistance, a recalculation of the resistivity values yields a resistivity of about 15 micro-ohms-cm, which is comparable to previously measured resistivities under the same deposition conditions. The same explanation holds for the higher resistivities measured for the semi-selective films. From the blanket film resistivity measurements shown in Tables VI and VII, and from previous resistivity measurements under the same deposition conditions (Table III) it is concluded that the resistivity of the selective films is in the range of 15–25 micro-ohms-cm.

It is also observed from Table VI that there is an optimum polysilicon deposition time (in this case 1.5 min) for selective deposition on the patterned polysilicon wafers, otherwise blanket deposition takes place. For the optimum polysilicon deposition time, decreasing the silicide deposition time improves the selectivity. SEM micrographs of a blanket (1.0 min polysilicon, 1.0 min silicide) and selective (1.5 polysilicon, 0.5 min silicide) titanium silicide films were taken. A residue on the oxide of the selective film was analyzed and determined to be titanium silicide particles. The residue problem could be alleviated by adopting an in-situ cleaning technique to replace the deposition of the thin polysilicon layer prior to the silicide deposition. In that case, the decomposition and reaction of TiCl$_4$ and SiH$_4$ should occur only on the exposed silicon patterns and not on the oxide regions. The silicide deposition time should still be optimized to obtain a selective deposition; otherwise, the silicide deposition on the oxide could be initiated by the reaction by-products. Reducing the polysilicon thickness is a possible alternative approach to eliminate the residue on the oxide.

A comparison between the semi-selective and selective depositions also reveals that the partial-loss of selectivity observed as the TiSi$_2$ deposition duration is increased could be due to the reaction by products reacting on the oxidized surface; a titanium silicide deposition will not occur on an oxidized surface from TiCl$_4$ and SiH$_4$. The resulting selective deposition also implies that the thin underlying deposited polysilicon is completely consumed and/or etched. The loss of selectivity for the 1.0 minute polysilicon deposition could result from the shorter time required to consume and/or etch the thinner deposited polysilicon layer, which would require a new optimized deposition time for the silicide. For example, a silicide deposition time of 20 seconds rather than 1.0 minute should yield a selective deposition.

It is observed from Table VII that for a polysilicon deposition of 1.5 minutes with different silicide deposition times (1 and 0.5 min), a blanket deposition occurs. If the polysilicon deposition time is decreased to 1.0 minute while keeping the silicide deposition time at 0.5 minutes, the deposition changes from blanket to semi-selective. Once the optimum polysilicon deposition time was established, decreasing the silicide deposition time resulted in a selective deposition. The different optimum polysilicon deposition times having the same silicide deposition times for the polysilicon and oxide patterned wafers could be due to the dissimilar nature of the silicon surface in the two cases, i.e., polysilicon surface versus single crystal surface. It was determined from etching and surface profilometry that 40% of the silicon in the thin titanium silicide film (less than 1000 Å) was provided by silicon substrate consumption. It is believed that further optimization of the process could reduce the substrate silicon consumption to even lower levels, although this percentage of consumption poses no limitations to the applicability of this selective deposition process to the fabrication of shallow junctions.

Conclusion

A system and a process have been developed for the VLPCVD of titanium silicide. The properties of the titanium silicide films have been optimized against pressure and SiH$_4$/TiCl$_4$ flow rate ratios at a constant temperature of 730° C. Smooth, reproducible, low resistivity (15-20 micro-ohms-cm) titanium silicide films have been deposited at a temperature of 730° C., a pressure of 67 mTorr, and a SiH$_4$/TiCl$_4$ flow rate ratio of 20/2. The as-deposited films had low resistivities and did not require any post-deposition annealing. During the experiments, it was observed that the SiH$_4$/TiCl$_4$ flow rate ratio is the primary variable that affects the titanium silicide film properties. A high flow rate ratio at a constant pressure results in whisker growth. However as the SiH$_4$/TiCl$_4$ flow rate ratio is reduced, film properties traverse from whiskerous films to smooth low resistivity films (15-20 micro-ohms-cm) to rough high resistivity films. All the as-deposited films had a Si/Ti metal ratio around 2 (determined by RBS). Within the Auger detection limit, no contamination was observed in the silicide films, and the films had uniform composition except for a transition region between the titanium silicide and the underlying polysilicon layers.

It was observed that a clean silicon surface (i.e., no native oxide) is necessary for the deposition of VLPCVD titanium silicide. The rate of the silicon consumption during the silicide deposition has been determined in conjunction with the dependence of this rate on the TiCl$_4$ flow rate. Increasing the TiCl$_4$ flow increases the polysilicon consumption rate. The dependence of the silicide deposition rate on the TiCl$_4$ flow rate was also discussed.

A method is also described for the blanket and selective deposition of titanium silicide on patterned wafers by a VLPCVD process. A thin polysilicon layer is deposited prior to the silicide deposition to promote the nucleation of titanium silicide. It is shown that the selective deposition is possible by controlling the polysilicon and the titanium silicide deposition times. The resistivity of the blanket and selective titanium silicide films is in the range of 15-25 micro-ohms-cm. It is also shown that by using SiH$_4$ and TiCl$_4$ as source gases, only 40% of the silicon in the titanium silicide film originates from the consumption of the underlying silicon substrate.

Equivalents

Those skilled in the art will recognize many equivalents to the specific embodiments described herein. Such equivalents are part of the invention and are intended to be covered by the following claims. For example, SiH$_2$Cl$_2$, SiHCl$_3$, SiCl$_4$ and Si$_2$H$_6$ may be used as silicon halide reactant in place of silane and organic titanium chemicals in place of TiCl$_4$. Also hydrogen gas may be added to the flow when it is desired to slow down the reaction.

I claim:

1. The method of forming titanium silicide over selected regions of a substrate patterned with exposed oxide regions and silicon regions in a low pressure chemical vapor deposition chamber comprising the steps of:
   (a) from a Si containing reactant gas depositing a thin layer of silicon over said exposed regions;
   (b) from Si and Ti containing reactant gasses promptly thereafter depositing titanium silicide for a period of time which initially results in substantial consumption of the thin silicon layer, thereby exposing said oxide regions and continuing said deposition to form titanium silicide only over the silicon regions and not over the now exposed oxide regions with the silicon for the continued deposition of titanium silicide being supplied primarily by the Si containing reactant.

2. The method of claim 1 wherein the deposition time in part (a) is about 40 seconds to 1.5 minutes.

3. The method of claim 2 wherein the deposition time in part (b) is about 20 to 30 seconds.

4. The method of claim 1 wherein the substrate temperature during step (a) is about 600° C. and the reactant for forming the silicon layer is a silicon halide.

5. The method of claim 4 wherein the substrate temperature during step (b) is about 730° C. and the reactants for forming the titanium silicide are a silicon halide and a titanium halide.

6. The method of claim 5 wherein the flow rate of silicon halide to titanium halide is 20/2 and the pressure in the chamber is 67 mTorr or less.

7. The method of forming titanium silicide over selected regions of a substrate patterned with exposed oxide regions and silicon regions in a chemical vapor deposition chamber comprising the steps of:
  (a) establishing a very low pressure condition in said chamber of about 67 mTorr, or less, from a gaseous silicon halide and depositing a thin layer of silicon over said exposed oxide regions and silicon regions at a substrate deposition temperature of about 600° C.;
  (b) from a gaseous silicon halide and a gaseous titanium halide promptly thereafter depositing titanium silicide at a substrate temperature of about 730° C. for a period of time which results in consumption of the thin layer of silicon, thereby re-exposing said oxide regions and continuing said deposition to form titanium silicide only over the silicon regions with the silicon for the continued deposition of titanium silicide being supplied from the gaseous silicon halide without substantial consumption of the remaining silicon in the silicon regions.

8. The method of claim 7 wherein the deposition time in part (a) is about 1.5 minutes, or less.

9. The method of claim 8 wherein the deposition time in part (b) is about 20 to 30 seconds.

10. The method of claim 1 wherein the flow rate of silicon halide to titanium halide is about 20/2.

11. A method of selectively forming titanium silicide in-situ over silicon regions of a patterned substrate in a cold walled reactor comprising the steps of:
  (a) mounting a substrate having patterned regions comprising exposed oxide regions and exposed silicon regions on a holder in the reactor;
  (b) bringing the pressure in the reactor to a relatively low pressure of about 67 mTorr, or less;
  (c) selectively heating the substrate with radiant thermal energy to bring the substrate to a predetermined temperature of about 600° C. at which formation of a silicon film from a known reactant will occur on the substrate; while keeping the reactor walls at a substantially lower temperature;
  (d) introducing a gaseous silicon atom containing reactant into the reactor to form a thin polysilicon layer on the patterned substrate;
  (e) promptly selectively heating the substrate and polysilicon layer by radiant thermal energy to bring the substrate and thin polysilicon layer to a predetermined temperature of about 730° C. suitable for formation of a titanium silicide layer while maintaining the reactor walls at a substantially lower temperature;
  (f) introducing a gaseous silicon atom containing reactant and a gaseous titanium atom containing reactant into the reactor to from a layer of titanium silicide only over the silicon regions by initially consuming the thin polysilicon layer until the oxide regions are once again exposed and continuing the reaction until the titanium silicide is formed only over the silicon regions by supplying silicon for the continuing formation from the gaseous silicon atom containing reactant without further substantial consumption of the remaining silicon in the silicon regions.

12. The method of claim 11 wherein the titanium atom containing reactant in step (f) is $TiCl_4$.

13. In a chemical vapor deposition chamber, the method of forming titanium silicide over polysilicon regions formed on a oxide layer in a pattern that exposes the polysilicon regions and selected oxide regions of the layer, said oxide layer covering a silicon substrate, comprising the steps of:
  (a) establishing a very low pressure condition in said chamber of about 67 mTorr, or less, from a gaseous silicon halide and depositing a thin layer of polysilicon over said oxide regions and polysilicon regions at a substrate deposition temperature of about 600° C.;
  (b) from a gaseous silicon halide and a gaseous titanium halide promptly thereafter depositing titanium silicide at a substrate temperature of about 730° C. for a period of time which results in consumption of the thin layer of polysilicon, thereby re-exposing said oxide regions and continuing said deposition to form titanium silicide only over the polysilicon regions with the silicon for the continued deposition of titanium silicide being supplied from the gaseous silicon halide without substantial consumption of the remaining silicon in the polysilicon regions.

14. In a chemical vapor deposition chamber, the method of forming titanium silicide over selected regions of a substrate of silicon, said substrate having exposed regions of oxide formed on it in a pattern that leaves regions of the substrate exposed, comprising the steps of:
  (a) establishing a very low pressure condition in said chamber of about 67 mTorr, or less, from a gaseous silicon halide and depositing a thin layer of silicon over said exposed regions of oxide and exposed regions of the substrate at a substrate deposition temperature of about 600° C.;
  (b) from a gaseous silicon halide and a gaseous titanium halide promptly thereafter depositing titanium silicide at a temperature of about 730° C. for a period of time which results in consumption of the thin layer of silicon, thereby re-exposing said regions of oxide and continuing deposition to form titanium silicide only over the silicon regions with the silicon for the continued deposition of titanium silicide being supplied from the gaseous silicon halide without substantial consumption of the silicon remaining in the substrate.

* * * * *

UNITED STATES PATENT AND TRADEMARK OFFICE
CERTIFICATE OF CORRECTION

PATENT NO. : 4,957,777

DATED : September 18, 1990

INVENTOR(S) : Vida Ilderem, L. Rafael Reif and Prabha K. Tedrow

It is certified that error appears in the above-identified patent and that said Letters Patent is hereby corrected as shown below:

Title page, after Item [22] insert:

---Related U.S. Application Data

File Wrapper Continuation of Ser. No. 300,332, January 23, 1989, abandoned, which is a Continuation-In-Part of Ser. No. 225,247, July 28, 1988, abandoned.---

Col. 16, line 64, delete "halide" and insert ---compound---.

Col. 16, line 67, delete "halide" and insert ---from the group consisting of silicon halides, silane or disilane---.

Col. 17, line 2, delete "halide" and insert ---compound---.

Col. 17, line 9, after "gaseous" insert ---Si reactant from the group consisting of---.

Col. 17, line 10, delete "halide" and insert ---halides or silane or disilane---.

Col. 17, line 31, before "silicon" insert ---the---.

Col. 17, line 31, delete "halide", first occurrence, and insert ---containing reactant---.

Col. 18, line 19, delete "halide" and insert ---from the group consisting of silicon halides, silane or disilane---.

Col. 18, line 23, delete "halide" and insert ---from the group consisting of silicon halides, silane or disilane---.

Col. 18, line 32, delete "halide" and insert ---compound---.

Col. 18, line 43, delete "halide" and insert ---from the group consisting of silicon halides, silane or disilane---.

Col. 18, line 47, delete "halide" and insert ---from the group consisting of silicon halides, silane or disilane---.

UNITED STATES PATENT AND TRADEMARK OFFICE
CERTIFICATE OF CORRECTION

PATENT NO. : 4,957,777

DATED : September 18, 1990

INVENTOR(S) : Vida Ilderem, L. Rafael Reif and Prabha K. Tedrow

It is certified that error appears in the above-identified patent and that said Letters Patent is hereby corrected as shown below:

Col. 18, line 56, delete "halide" and insert ---compound---.

Signed and Sealed this

Sixteenth Day of June, 1992

*Attest:*

DOUGLAS B. COMER

*Attesting Officer*     Acting Commissioner of Patents and Trademarks